United States Patent [19]

Ostwald et al.

[11] Patent Number: 4,975,160

[45] Date of Patent: Dec. 4, 1990

[54] PROCESS FOR WET CHEMICAL METALLIZATION OF A SUBSTRATE

[75] Inventors: Robert Ostwald, Ulm; Gabriele Voit, Biberach; Reinhard Schödlbaur, Bellenberg; August-F. Bogenschütz, Oberdischingen, all of Fed. Rep. of Germany

[73] Assignee: Licentia Patent-Verwaltungs-GmbH, Frankfurt, Fed. Rep. of Germany

[21] Appl. No.: 342,694

[22] Filed: Apr. 24, 1989

Related U.S. Application Data

[63] Continuation of Ser. No. 850,549, Apr. 11, 1986, abandoned.

[30] Foreign Application Priority Data

Apr. 13, 1985 [DE] Fed. Rep. of Germany ....... 3513266
May 24, 1985 [DE] Fed. Rep. of Germany ....... 3518767

[51] Int. Cl.$^5$ .................. C25D 5/54; C25D 15/02
[52] U.S. Cl. .................... 204/30; 204/37.1; 204/38.4
[58] Field of Search .......... 204/20, 30, 38.4, 27.1

[56] References Cited

U.S. PATENT DOCUMENTS

| | | | |
|---|---|---|---|
| 3,147,547 | 9/1964 | Kuebrich et al. | 204/32.1 X |
| 3,687,824 | 8/1972 | Brown | 204/40 |
| 3,723,078 | 3/1973 | Parker | 29/194 |
| 3,753,816 | 9/1973 | Feldstein et al. | 156/11 |
| 3,767,538 | 10/1973 | Politycki et al. | 204/30 |
| 4,160,707 | 7/1979 | Helle et al. | 204/37.1 |
| 4,285,782 | 8/1981 | Waldrop et al. | 204/32.1 |
| 4,358,922 | 11/1983 | Feldstein | 57/401 |

FOREIGN PATENT DOCUMENTS

| | | |
|---|---|---|
| 2150145 | 4/1972 | Fed. Rep. of Germany . |
| 1551555 | 12/1968 | France . |
| 2179107 | 11/1973 | France . |
| 1253505 | 11/1971 | United Kingdom . |
| 1380890 | of 1975 | United Kingdom . |

OTHER PUBLICATIONS

*IBM Technical Disclosure Bulletin*, vol. 20, No. 8, Jan., 1978, p. 3079.

*Primary Examiner*—John F. Niebling
*Assistant Examiner*—William T. Leader
*Attorney, Agent, or Firm*—Spencer & Frank

[57] ABSTRACT

A process for wet chemical metallization of a substrate includes the steps of cleansing the substrate to be metalized; precipitating an electrically highly conductive gas and vapor permeable metal base layer onto the cleansed substrate from a wet chemical metallization bath; precipitating a metal layer which is comprised of at least one metal and at least one kind of non-metallic particles onto the metal base layer by electrolytic deposition from a bath comprised of at least one electrolyte; and at least one kind of finely dispersed non-metallic particles and subjecting the metallized substrate to at least one heat treatment whereby volatile components embedded in the metal base layer and the metal layer are removed and the volume of the non-metallic particles in the metal layer is reduced. In a preferred embodiment the metal layer is comprised of copper and about 5 percent by weight of ceramic particles having a diameter of less than 10 μm.

6 Claims, No Drawings

PROCESS FOR WET CHEMICAL METALLIZATION OF A SUBSTRATE

This application is a continuation of application Ser. No. 06/850,549, filed Apr. 11, 1986, now abandoned.

BACKGROUND OF THE INVENTION

1. Field of the Invention

The present invention relates to a process for wet chemical metallization of a substrate by precipitating a metal layer onto a cleansed, and optionally roughened, substrate.

2. Background of the Art

Various substrate materials, metallic and non-metallic, are frequently covered with metal layers so as to produce certain functional or decorative characteristics. These metal layers generally must be able to withstand various stresses encountered during subsequent processing or in use. In particular, a permanent and sufficiently great adhesion between the substrate material and the metal layer is a basic prerequisite for practical use. Adhesion must be sufficient also under high mechanical loads from thermal stresses due to high temperatures or due to fluctuations in temperature.

Generally the adhesion of metal layers to non-metallic substrates is not great enough to prevent bubble formation in the metal layer under thermal stresses encountered, for example, during soft soldering. For this reason, only such processes as, for example, vacuum vapor deposition, cathode sputtering or the chemical vapor deposition (CVD) technique, which require expensive apparatus and are generally not economical, are available for the production of metallizations on non-conductors which are to be subjected to thermal stresses.

It is an object of the present invention to provide a process of the above-identified species which permits, in particular, the economical, wet chemical metallization of a substrate, especially an electrically insulating substrate, so that the best possible adhesion of the metal layer to the substrate is realized and the metallization is thermally stressable, particularly when subjected to a soft soldering process as is customarily used in electrical applications.

SUMMARY OF THE INVENTION

This object is accomplished by providing a process for wet chemical metallization of a substrate including the steps of cleansing the substrate to be metallized; precipitating at least one electrically conductive gas and vapor permeable metal layer onto the cleansed substrate from a wet chemical metallization bath comprised of at least one electrolyte; and subjecting the at least one metal layer to at least one heat treatment whereby volatile components embedded in the layer are removed.

The invention is based on the realization that mechanical stresses between a substrate and a deposited metal layer are not only caused by differences in respective coefficients of thermal expansion, but also by changes in the respective materials themselves and gaseous inclusions at the interface(s) of the materials. For example, during the electro-chemical precipitation of metal, relatively large quantities of hydrogen, as well as various electrolyte additives, which additives are typically organic in nature, are incorporated in the metal layer. Residues of electrolyte and/or water may also be incorporated during the precipitation, particularly precipitations onto roughened substrates. Subsequent exposure to heat may then cause one or more of these substances to develop a high gas pressure depending on the temperature employed, from bond cleavage, evaporation, and/or decomposition thereof.

Applicants have discovered that these undesirable effects can be substantially reduced or eliminated by heat treatment to cause diffusion and/or to induce removal of vaporized components by other techniques which do not destroy the metal layer, such as incorporation of embedded particles into the metal layer If the vaporized components are not removed, the metal layer separates from the substrate material forming bubbles which later chip and/or peel exposing relatively large areas of the substrate. The better the adhesion of the metal layer to the substrate, the higher the temperature which can be employed non-destructively. Thus, the highest possible temperature resistance is desirable, particularly for metallized substrates to be subsequently exposed to soldering and welding processes.

In particular, the inventive process makes possible the application of a bubble-free, wet chemical copper metallization onto ceramic substrates because of the heat treatment of the metal layer, which is a gas and vapor permeable metal layer. The adhesion of such a metallization remains good even if subsequently exposed to thermal stresses, such as soft soldering at about 280° C. for about 20 seconds, or to hard soldering at 400° C. for about 5 seconds.

Thus, in a process for wet chemical metallization of an electrically insulating ceramic substrate including the known steps, in the sequence recited, of immersing the substrate in a sodium hydroxide melt to remove a portion thereof and to roughen the surface; providing a catalytic germination layer capable of catalyzing the electroless deposition of metals thereon on the substrate by treating the substrate successively in a solution of tin-II chloride, in water, and in a solution of palladium chloride, precipitating a metal base layer on the germination layer by an electroless deposition from a chemical bath, said chemical bath being comprised of at least one metal which is electrically highly conductive, the improvement according to the present invention includes the steps of electrolytically precipitating at least one electrically highly conductive and gas and vapor permeable metal layer onto the metal base layer from an electrolyte; and subjecting each of the at least one electrically conductive and gas and vapor permeable layer to a heat treatment, whereby volatile components embedded therein are removed, prior to the electrolytic precipitation thereon of a further metal layer.

The present invention thus contemplates application of metal layers onto substrates which are electrically insulating, as well as those which are electrically conductive. When the substrate is an electrically insulating substrate, it may be composed of, for example, at least one ceramic material and the surface thereof to be coated is provided with a germination layer by the well known technique described above and in the working examples which follow. A metal base layer may then be precipitated by an electroless deposition from a chemical bath. The metal of the base layer preferably contains at least one electrically highly conductive metal or metal alloy. The metal base layer may then be reinforced, i.e., built up, by electroplating an additional metal layer or layers thereon using the metal base layer as an electroplating electrode. Thus, for example, the metal of the base layer may be copper and the at least one metal layer may also be copper. The wet chemical metallization bath may include particulate materials which are preferably inorganic materials. These particulates are suspended in the bath and are incorporated in the precipitated metal layer. About 5 percent by weight of ceramic particles having a diameter of less than 10 $\mu$m may be included in the at least one metal layer in this ceramic substrate/copper metal layer example.

It is most preferable that the wet chemical metallization bath consist essentially of inorganic components including at least one electrolyte, such as $SO_4^{2-}$, $PO_4^{3-}$, $P_2O_7^{4-}$, $CN^{31}$, $Cl^-$, $BF_4^-$ and $NH_2SO_3^-$, and be free of organic additives. Freedom from organic additives eliminates the possibility of inclusion thereof in the metal layer and, thus, eliminate one potential source of vaporizable components which might influence the adhesion characteristics of the metal layer.

In a preferred embodiment, at least two electrically highly conductive and gas and vapor permeable metal layers are precipitated sequentially. Each metal layer is subjected to a heat treatment prior to the precipitation of the next sequentially precipitated metal layer. The precipitations may both be electrolytic precipitations onto an electrically conductive substrate. Alternately, the first precipitation may be an electroless deposition onto a prepared electrically insulating substrate and the second precipitation may be an electrolytic precipitation.

Preferably, the metallization bath includes finely dispersed inorganic particles having a diameter ranging from 0.1 $\mu$m to 20 $\mu$m suspended therein. Alternately, the process may include the further step of adhering particles having a diameter ranging from 0.1 $\mu$m to 20 $\mu$m to the substrate using adhesive means, such as an adhesive or a glue, prior to precipitating the at least one metal layer thereon. These finely dispersed inorganic particles may, for example, contain carbon, at least one inorganic component, at least one organic component or mixtures thereof.

When the metallization bath includes finely dispersed inorganic particles, these particles preferably have a melting point in excess of 200° K. As previously described, these particles are embedded in the metal layer or layers during the precipitation thereof from the metallization bath. These particles render the metal layer or layers gas and vapor permeable. Alternately, the metal layer or layers may be particle-free, but have a thickness which renders same gas and vapor permeable thereof.

When the metallization bath includes finely dispersed inorganic particles, the particles preferably have a diameter of less than 10 $\mu$m. The particles may be colloidal particles and may have a diameter of less than 1 $\mu$m. The particles may be produced in the bath by, for example, adjusting the concentration ratios of inorganic components or by adjusting the pH of the bath to cause precipitation of particulates. Alternately, particulates can be nucleated in the metal layer by treating same according to known methods to cause particles to form in the metal layer Further, whenever particulates are included in the metal layer, the process may advantageously include the further step of reducing the volume of the particles embedded in the metal layer by, for example, a physical treatment, a chemical treatment, or a treatment including physical and chemical treatment steps. Thus, the volume of the particles embedded in the at least one metal layer may be reduced by selective dissolution, decomposition, and sublimation. Alternately, the volume of the particles embedded in the at least one metal layer may be reduced by thermally treating same to accomplish fragmention i.e., bond cleavage, evaporation, sublimation, or by subjecting same to a redox reaction.

DESCRIPTION OF THE PREFERRED EMBODIMENTS

The present invention will now be described in greater detail with reference to specific examples:

Example 1

Ceramic substrates of aluminum oxide (99.5% $Al_2O_3$) having a thickness of about 0.6 mm were freed of their glass-like "firing skin" by the well-known technique of immersion in a sodium hydroxide melt, and were thoroughly rinsed with ultrasonic agitation in demineralized water. By successive treatments in a solution of tin-II chloride, in water and in a solution of palladium chloride, and subsequent rinsing in demineralized water, a catalytic germination layer was produced by this conventionally known process on the ceramic surface so as to create a catalytic effect for subsequent electroless deposition of metals. Onto this germination layer, a copper base layer having a thickness of approximately 0.3 $\mu$m was precipitated from a commercially available copper bath. Thereafter, this layer was electro-chemically reinforced, i.e., its thickness was increased, by electrolytically precipitating copper to produce a copper layer having a thickness of approximately 2 $\mu$m from an electrolytic bath having the following composition:

100 g/l copper diphosphate,
280 g/l potassium diphosphate,
15 g/l potassium nitrate, and
2 ml/l concentrated ammonia solution.

The electrolytic precipitation was effected at a pH of 8.7, a bath temperature of 60° C. and with a current density of 2 A/dm$^2$. After rinsing in demineralized water, this coated substrate was dried and tempered for 15 minutes in a nitrogen atmosphere at 300° C. Then, the copper layer was further reinforced electrochemically from the above-mentioned bath to a total layer thickness of about 15 $\mu$m. The coated substrate was tempered for 10 minutes in a nitrogen atmosphere at 400° C. The resulting copper layer was free of bubbles and had a perfect appearance. After producing test strips by photoetching, the strips were subjected to peel strength testing using a tensile strength testing machine. The copper layer required a peeling force of approximately 0.5 N/mm to be separated from the ceramic surface. The tensile strength testing machine was of type 7700 from the German firm Zwick GmbH & Co., 7900 Ulm-Einsinger.

Example 2

Ceramic substrates of aluminum oxide were pretreated as in Example 1 and were provided with a copper base layer by electroless deposition. The electrochemical reinforcement to a laYer thickness of about 15 $\mu$m was effected from an electrolyte bath having the following composition:

240 g/l copper fluoroborate,
20 g/l fluoroboric acid, and
20 g/l boric acid.

Additionally, 5 g/l of a finely dispersed aluminum oxide, whose particle diameters are less than 10 $\mu$m and preferably lie in a range from 1 $\mu$m to 5 $\mu$m, are suspended in the electrolyte by intensive stirring The electrolytic precipitation took place at a pH of 1.0, a bath temperature of 30° C. and with a current density of 5 A/dm². Copper layers so produced exhibited a uniformly silky matte appearance and, after being subjected to thermal treatment for 20 minutes at 400° C. in nitrogen, exhibited a peel strength of 0.6 N/mm and was free of bubbles.

Example 3

Ceramic substrates were pretreated as in Example 1 and provided with a copper base layer. The copper electrolyte bath of Example 1 was used except that a 1% potassium hydroxide solution was used instead of the concentrated ammonia solution and was mixed in a drop-wise manner until a pH of 8.7 was reached. A colloid of basic copper phosphate formed and made the electrolyte bath milky opaque. The copper base layer was reinforced in this electrolyte bath without interruption at 60° C. and with a current density of 2 A/dm² until a total layer thickness of 15 $\mu$m was realized. The copper layers were observed to have a silky matte appearance and were then subjected to thermal treatment for 20 minutes at 400° C. under nitrogen The copper layers were free of bubbles and exhibited a peel strength of 0.5 N/mm.

Example 4

Ceramic substrates of aluminum oxide (99.5 % Al$_2$O$_3$) and having a thickness of approximately 0.6 mm were freed of their glass-like "firing skin" by the well-known technique of immersion in a sodium hydroxide melt and were thoroughly rinsed in demineralized water with ultrasonic agitation. Successive treatments in a solution of tin-II chloride solution, in water and in a solution of palladium chloride, and final rinsing in demineralized water produced, according to a known process, a catalytic germination layer on the ceramic surface so as to create a catalytic effect for subsequent electroless deposition. Onto this germination layer, a copper base layer having a thickness of approximately 0.2 $\mu$m was precipitated from a commercially available copper chemical bath. Thereafter, this layer was electrochemically reinforced to a total layer thickness of about 5 $\mu$m in a commercially available electrochemical copper sulfate bath in which graphite particles having a grain size of less than 10 $\mu$m were suspended in a concentration of about 15 g/l. The resulting copper layers were observed to have a dark matte appearance and were then heat treated for approximately 10 minutes at a temperature of about 400° C. in a hydrogen atmosphere. A subsequent microscopic examination did not reveal any bubbles in the copper layer.

Example 5

Ceramic substrates of aluminum oxide were pretreated as in Example 1 and were provided with a copper base layer having a thickness of approximately 0.2 $\mu$m in a currentless chemical process. Thereafter, the layer was electrochemically reinforced to a thickness of about 7 $\mu$m from a commercially available electrochemical copper bath in which particles containing polyacrylic acid ester were suspended in a concentration of about 10 g/l. These particles were produced by adding to the bath a commercially available dispersion manufactured by the German firm BASF under the trade name "Acronal 4F". The copper layers had a silky matte appearance and, after tempering thermal after-treatment for 10 minutes at a temperature of about 400° C. in a nitrogen atmosphere, exhibited no bubbles whatsoever.

The inventive process is not limited to the above-described steps and exemplary materials, but can be modified to suit the intended application and can be applied correspondingly to other materials. For example, it is possible to embed particles of $SiO_2$, $Si_3N_4$ or SiC in the metal layer instead of the $Al_2O_3$ particles recited in the examples.

It will be understood that the above description of the present invention is susceptible to various modifications, changes and adaptations, and the same are intended to be comprehended within the meaning and range of equivalents of the appended claims.

What is claimed is:

1. A process for wet chemical metallization of a substrate which is a non-metallic, electrically insulating substrate, the process comprising:
   a. cleansing the substrate to be metallized to provide a cleansed substrate;
   b. precipitating a catalytic germination layer onto at least one surface of the cleansed substrate, the catalytic germination layer being capable of catalyzing electroless deposition of metals thereon and being provided by treating the cleansed substrate in at least one chemical bath;
   c. precipitating a metal base layer, which is thin, gas and vapor permeable, and electrically conductive, onto the catalytic germination layer of step b by electroless deposition from a chemical bath comprised of at least one metal which is highly electrically conductive to provide the metal base layer;
   d. precipitating a metal layer, which is electrically conductive and which is comprised of at least one metal and at least one kind of non-metallic particles, onto the metal base layer by electrolytic deposition from a metallization bath comprised of at least one electrolyte and at least one kind of finely dispersed non-metallic particles to provide a metallized substrate, wherein, in the metallization bath of step d, the at least one kind of finely dispersed non-metallic particles are produced in the bath,
   wherein the bath comprises at least one kind of non-metallic substance in solution therein and each of the at least one kind being present in a concentration thereof, and
   wherein the at least one kind of finely dispersed non-metallic particles are produced in the bath by one of adjusting concentration ratios of the at least one kind of non-metallic substance or adjusting the pH of the bath; and
   e. subjecting the metallized substrate of step d to a treatment to reduce the volume of the at least one kind of non-metallic particles included within the metal layer by physico-chemical means selected from the group consisting of selective dissolution, selective decomposition, thermal treatment to accomplish one of bond cleavage, evaporation and selective sublimation, and subjecting to a redox reaction, to thereby provide a metallized substrate having a metal layer which is gas and vapor permeable, and to remove volatile substances from the metal base layer and the metal layer.

2. The process of claim 1, wherein the metal layer is a plurality of metal layers prepared by repeating steps d and e.

3. The process according to claim 1, wherein, in the metallization bath of step d, the at least one kind of finely dispersed non-metallic particles have a diameter of less than 10 μm and have a melting point in excess of 200° K., and wherein the particles are embedded in the metal layer during the precipitation of the metal layer from the metallization bath.

4. The process according to claim 1, wherein the at least one electrolyte of the metallization bath of step d is selected from the group consisting of $SO_4^{2-}$, $PO_4^{3-}$, $P_2O_7^{4-}$, $CN^-$, $Cl^-$, $BF_4^-$ and $NH_2SO_3^-$.

5. The process according to claim 1, wherein, in the metallization bath of step d, the at least one kind of finely dispersed non-metallic particles are colloidal particles having a diameter of less than 1 μm.

6. A process for wet chemical metallization of a substrate which is comprised of at least one ceramic material and which is electrically insulating, the process comprising:
   a. cleansing the substrate to be metallized to provide a cleansed substrate;
   b. precipitating a catalytic germination layer onto at least one surface of the cleansed substrate, the catalytic germination layer being capable of catalyzing electroless deposition of metals thereon and being provided by treating the cleansed substrate in at least one chemical bath;
   c. precipitating a metal base layer, which is thin, gas and vapor permeable, and electrically conductive, onto the catalytic germination layer of step b by electroless deposition from a chemical bath comprised of at least one metal which is highly electrically conductive to provide the metal base layer;
   d. precipitating a metal layer, which is electrically conductive and which is comprised of copper and about 5 percent by weight of ceramic particles having a diameter of less than 10 μm, onto the metal base layer by electrolytic deposition from a metallization bath comprised of at least one electrolyte and finely dispersed ceramic particles to provide a metallized substrate; and
   e. subjecting the metallized substrate of step d to a treatment to reduce the volume of the at least one kind of non-metallic particles included within the metal layer by physico-chemical means selected from the group consisting of selective dissolution, selective decomposition, thermal treatment to accomplish one of bond cleavage, evaporation and selective sublimation, and subjecting to a redox reaction, to thereby provide a metallized substrate having a metal layer which is gas and vapor permeable, and to remove volatile substances from the metal base layer and the metal layer.

* * * * *